United States Patent [19]

Gladden et al.

[11] Patent Number: 5,414,714
[45] Date of Patent: May 9, 1995

[54] METHOD AND APPARATUS FOR SCAN TESTING AN ARRAY IN A DATA PROCESSING SYSTEM

[75] Inventors: Michael E. Gladden; Robert J. Skruhak; Oded Yishay, all of Austin, Tex.; Eytan Hartung, Ramat Gan, Israel

[73] Assignee: Motorola, Inc., Schaumburg, Ill.

[21] Appl. No.: 857,878

[22] Filed: Mar. 26, 1992

[51] Int. Cl.⁶ .................. G01R 31/28; G06F 11/00
[52] U.S. Cl. .................. 371/22.3; 371/22.1; 324/158.1
[58] Field of Search .............. 371/22.1, 22.2, 22.3, 371/22.4, 22.5, 22.6; 324/158 R; 377/29, 70, 73

[56] References Cited

U.S. PATENT DOCUMENTS

| | | | |
|---|---|---|---|
| 4,477,902 | 10/1984 | Puri et al. | 371/22.3 X |
| 4,542,509 | 9/1985 | Buchanan et al. | 371/22.3 X |
| 4,697,267 | 9/1987 | Wakai | 371/22.3 |
| 4,697,279 | 9/1987 | Baratti et al. | 377/73 |
| 4,733,405 | 3/1988 | Shimizume et al. | 377/29 |
| 4,833,676 | 5/1989 | Koo | 371/22.3 |
| 4,862,068 | 8/1989 | Kawashima et al. | 324/158 R |
| 4,876,704 | 10/1989 | Ozaki | 377/70 |
| 4,897,838 | 1/1990 | Tateishi | 371/22.3 |
| 5,155,432 | 10/1992 | Mahoney | 324/158 R |
| 5,210,759 | 5/1993 | DeWitt et al. | 371/22.3 |
| 5,252,917 | 10/1993 | Kadowaki | 324/158 R |
| 5,253,255 | 10/1993 | Carbine | 371/22.3 X |
| 5,285,453 | 2/1994 | Gruodis | 371/22.3 X |

OTHER PUBLICATIONS

Eytan Hartung, Mike Gladden and Oded Yishay, "A Dual Pass Scan Mechanism for Minimizing Serial Scan Outputs", Jul. 1981, Motorola Technical Developments, vol. 13, pp. 14–15.

J. Lyon, M. Gladden, E. Hartung, E. Hoang, and K. Raghunathan, "Testability Features of the 68HC16Z1", 1991 IEEE Intl. Test Conference on Oct. 28, 1991; submitted after Jul. 16, 1991; pp. 5–6.

Dilip K. Bhavsar, "A New Economical Implementation for Scannable Flip-Flops in MOS", Jun. 1986, IEEE Design & Test, pp. 52–56.

Grady Giles, "Scan Path to Inject or Read Out Microcode", Oct. 1985, Motorola Technical Developments, vol. 5, p. 53.

Primary Examiner—Emanuel T. Voeltz
Assistant Examiner—Eric W. Stamber
Attorney, Agent, or Firm—Susan C. Hill

[57] ABSTRACT

A method and apparatus for scan testing an array (20) in a data processing system (10). In one form, the present invention uses a scanning sense amplifier (22x) which can perform the three functions of a sense amplifier, a master test latch for scan testing, and a slave test latch for scan testing. Using one scanning sense amplifier (22x) to perform all three functions reduces the amount of circuitry required to scan test an array (20). The same stimulus is applied twice to the array (20); and half of the output data bits are scanned out during each application of the stimulus. One extra output data bit is also scanned out during each application of the stimulus. The end result is a reduction in the circuitry required to perform scan testing.

20 Claims, 4 Drawing Sheets

| TIME PERIOD | CONTENTS OF THE SCANNING SENSE AMPS (SSA) | | | | | | | | SCAN DATA OUTPUT |
|---|---|---|---|---|---|---|---|---|---|
| | SSA 22a | SSA 22b | SSA 22c | SSA 22d | SSA 22e | SSA 22f | SSA 22g | SSA 22h | |
| 1 | a | b | c | d | e | f | g | h | → h |
| 2 | a | a | c | c | e | e | g | g | → g |
| 3 | 0 | a | a | c | c | e | e | g | → g |
| 4 | 0 | 0 | a | a | c | c | e | e | → e |
| 5 | 0 | 0 | 0 | a | a | c | c | e | → e |
| 6 | 0 | 0 | 0 | 0 | a | a | c | c | → c |
| 7 | 0 | 0 | 0 | 0 | 0 | a | a | c | → c |
| 8 | 0 | 0 | 0 | 0 | 0 | 0 | a | a | → a |
| 9 | 0 | 0 | 0 | 0 | 0 | 0 | a | a | → a |
| 10 | 0 | 0 | 0 | 0 | 0 | 0 | a | a | |

| TIME PERIOD | CONTENTS OF THE SCANNING SENSE AMPS (SSA) | | | | | | | | SCAN DATA OUTPUT |
|---|---|---|---|---|---|---|---|---|---|
| | SSA 22a | SSA 22b | SSA 22c | SSA 22d | SSA 22e | SSA 22f | SSA 22g | SSA 22h | |
| 11 | a | b | c | d | e | f | g | h | → h |
| 12 | a | b | c | d | e | f | g | h | → h |
| 13 | 0 | b | b | d | d | f | f | h | → h |
| 14 | 0 | 0 | b | b | d | d | f | f | → f |
| 15 | 0 | 0 | 0 | b | b | d | d | f | → f |
| 16 | 0 | 0 | 0 | 0 | b | b | d | d | → d |
| 17 | 0 | 0 | 0 | 0 | 0 | b | b | d | → d |
| 18 | 0 | 0 | 0 | 0 | 0 | 0 | b | b | → b |
| 19 | 0 | 0 | 0 | 0 | 0 | 0 | b | b | → b |
| 20 | 0 | 0 | 0 | 0 | 0 | 0 | b | b | |

FIG.7

METHOD AND APPARATUS FOR SCAN TESTING AN ARRAY IN A DATA PROCESSING SYSTEM

FIELD OF THE INVENTION

The present invention relates in general to data processors, and more particularly to scan testing an array in a digital data processor.

BACKGROUND OF THE INVENTION

The ability to test the circuitry on an integrated circuit in an efficient manner is very important. Many integrated circuits, such as microprocessors and peripherals, use structured arrays such as programmable logic arrays (PLAs), random access memory (RAM), read only memory (ROM), and other array-type structures. In order to provide observability of these array-type structures, the output signals produced by the array must be transferred off the integrated circuit by way of one or more integrated circuit pins.

Most arrays produce multiple parallel outputs. It would waste a great deal of silicon area to route all of these parallel outputs directly to test circuitry or to integrated circuit pins. Instead, a serial shift path or scan path is used at the output of the array. The parallel array outputs are thus converted into a serial bit stream called the scan data output. The first parallel output signal becomes the first bit of the scan data output. The second parallel output signal becomes the second bit of the scan data output, and so on. Only a single output, the scan data output, must be routed from the array to test circuitry or to a pin.

Array structures typically require some type of bit line sensing circuitry for each output. A sense amplifier, or sense amp, is normally used to perform this bit line sensing function for each output. Each sense amplifier is then followed by a master/slave test latch in order to support the scan testing. The master/slave test latches are coupled together to form a shift register structure. These master/slave test latches are not used during normal operation, but are extra circuitry required only for testing purposes.

The scan testing of the array is performed in the following manner. First, an input stimulus is given to the array and the array is enabled. Second, each sense amplifier senses the state of its output Line and stores this value in its associated master test latch. Third, each master test latch shifts the output data into its associated slave test latch. Fourth, each slave test latch shifts the output data into the adjacent master test latch in the same direction.

The last slave test latch has no adjacent master test latch, but instead shifts its output data onto a data path that will lead to test circuitry. The test circuitry may be located on the integrated circuit, or may be a testing device that communicates with the integrated circuit through one or more pins. The third and fourth steps are repeated until all of the output data has been shifted onto the data path leading to the test circuitry. Then the procedure starts over again with the first step using a different input stimulus. In this manner, the output data is serially shifted, one bit at a time, to the test circuitry. The slave latches are used in order to prevent any of the latched data from being overwritten.

In order to reduce test circuitry, some array structures do not use master test latches, but instead use the sense amplifiers for dual purposes. Each sense amplifier is used as a sense amplifier and is also used to perform the latching function of a master test latch during scan testing. However, the slave test latch is still required to perform a second latching function.

The second, third, and fourth steps are performed in the following manner. For the second step, each sense amplifier senses the state of its output line and stores this value in its own circuitry. For the third step, each sense amplifier shifts the output data into its associated slave test latch. And for the fourth step, each slave test latch shifts the output data into the adjacent sense amplifier in the same direction. The third and fourth steps are repeated until all of the output data has been shifted onto the data path leading to the test circuitry. Unfortunately, this approach still requires slave test latches which are extra circuitry used only for testing purposes.

SUMMARY OF THE INVENTION

The previously mentioned needs are fulfilled and other advantages achieved with the present invention. In one form, the present invention comprises an apparatus and a method for serially scanning data from an array in a data processing system. The method includes the step of receiving a first value from the array and storing the first value in a first latch, the step of receiving a second value from the array and storing the second value in a second latch, the step of receiving a third value from the array and storing the third value in a third latch, and the step of receiving a fourth value from the array and storing the fourth value in a fourth latch.

In addition, the method includes the step of overwriting the first value in the first latch with the second value from the second latch so that the first and second latches both contain the second value. The method includes the step of overwriting the third value in the third latch with the fourth value from the fourth latch so that the third and fourth latches both contain the fourth value. And the method also includes the step of overwriting the second value in the second latch with the fourth value so that the second and third latches both contain the fourth value. The present invention will be understood by one skilled in the art from the detailed description below in conjunction with the accompanying drawings.

DESCRIPTION OF THE PREFERRED EMBODIMENT

The terms "assert" and "negate" will be used when referring to the rendering of a signal, status bit, or similar apparatus into its logically true or logically false state, respectively. "Active" is used to describe a signal, status bit, or similar apparatus that has been asserted. "Non-active" is used to describe a signal, status bit, or similar apparatus that has been negated.

In order to reduce test circuitry, the present invention uses a new scheme for scan testing an array-type structure. Prior art devices shifted the output data in a manner that required a minimum of two latching functions per output signal. The present invention uses a different shifting scheme that only requires a minimum of one latching function per output signal.

In the new shifting scheme, alternate latches are allowed to overwrite the data stored in the next adjacent latch. Thus, during a first scan test of the array outputs, the original data from the even latches is overwritten and the original data from the odd latches is scanned out. And during a second scan test of the array outputs, the original data from the odd latches is overwritten and the original data from the even latches is scanned out. In alternate embodiments of the present invention, the original data from the even latches could be scanned out first. The latches are connected in a series-connected chain with the last latch providing an output signal that can be used to determine if the array has malfunctioned. By "even" latches is meant the second, fourth, sixth, and other even numbered latches. And by "odd" latches is meant the first, third, fifth, and other odd numbered latches.

The present invention uses the sense amplifier for each output signal to perform the single required latching function. A slave test latch is no longer required for each output signal of the array. Thus, extra test circuitry required to perform scan testing has been reduced. In addition, the size of clock drivers to the latches are reduced because there are fewer latches to drive. Removing circuit devices and reducing the size of circuit devices has the desirable effect of reducing both the semiconductor area and the overall power consumption of the circuitry.

Figure 1:
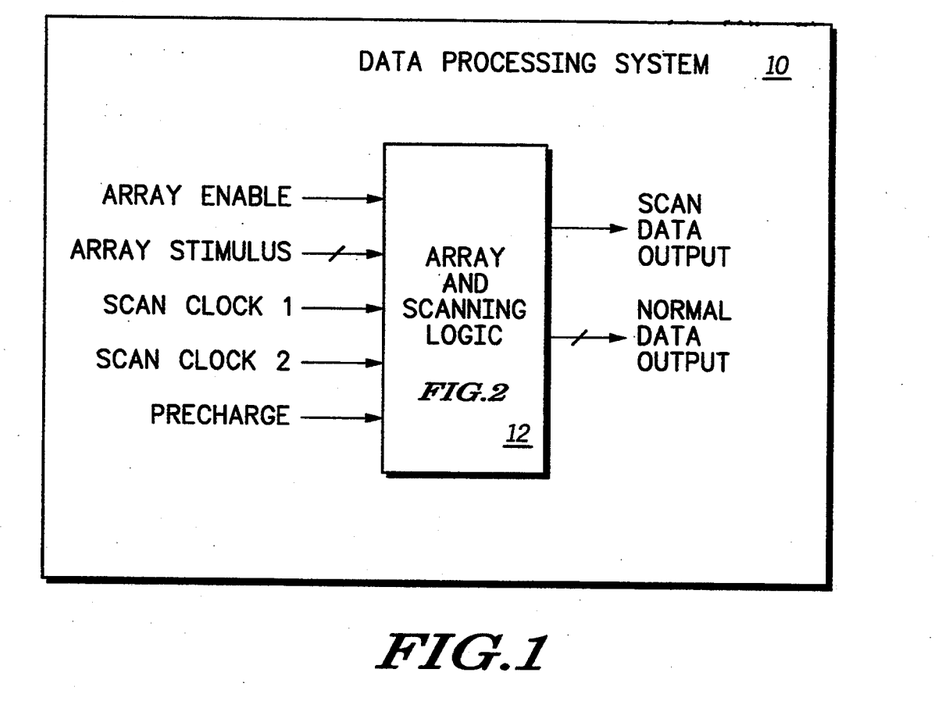
FIG. 1 illustrates, in block diagram form, a data processing system in accordance with one embodiment of the present invention.

FIG. 1 illustrates a data processing system 10 having array and scanning logic 12. Array and scanning logic 12 receives five input signals, namely ARRAY ENABLE, ARRAY STIMULUS, SCAN CLOCK 1, SCAN CLOCK 2, and PRECHARGE. ARRAY STIMULUS could be one signal inputting data serially; or ARRAY STIMULUS could be multiple signals inputting data in parallel. Array and scanning logic 12 generates two output signals, namely SCAN DATA OUTPUT and NORMAL DATA OUTPUT. NORMAL DATA OUTPUT could be one signal outputting data serially; or NORMAL DATA OUTPUT could be multiple signals outputting data in parallel.

Figure 2:
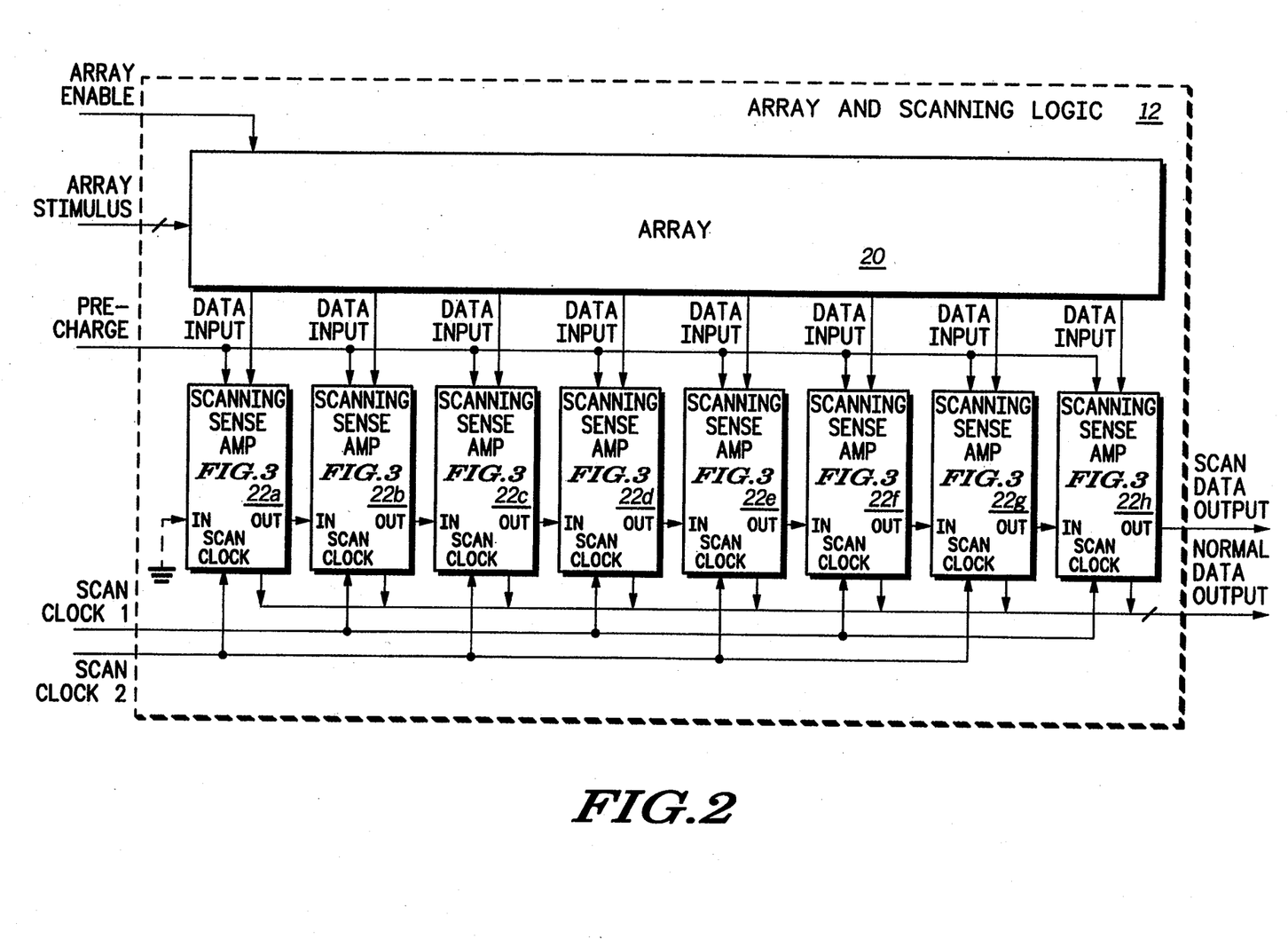
FIG. 2 illustrates, in block diagram form, array and scanning logic of FIG. 1 in accordance with one embodiment of the present invention.

FIG. 2 illustrates, in more detail, the array and scanning logic 12 of FIG. 1. An array 20 receives ARRAY ENABLE and ARRAY STIMULUS as input signals. Array 20 generates one DATA INPUT signal for each scanning sense amplifier (22a–22h). Each scanning sense amplifier (22a–22h) also receives the PRECHARGE signal as an input. Scanning sense amplifiers 22b, 22d, 22f, and 22h each receive SCAN CLOCK 1 as a SCAN CLOCK input signal. Scanning sense amplifiers 22a, 22c, 22e, and 22g each receive SCAN CLOCK 2 as a SCAN CLOCK input signal. Each scanning sense amplifier (22a–22h) generates a signal which is output from the array and scanning logic 12 as NORMAL DATA OUTPUT.

Scanning sense amplifier 22a can receive an input signal labelled IN from another scanning sense amplifier (not shown) or from another circuit (not shown). In the illustrated embodiment, the IN input to scanning sense amplifier 22a is simply connected to ground. Scanning sense amplifier 22a generates an output signal OUT, which is received by scanning sense amplifier 22b as an input signal labelled IN. Scanning sense amplifier 22b generates an output signal OUT, which is received by scanning sense amplifier 22c as an input signal labelled IN. Scanning sense amplifier 22c generates an output signal OUT, which is received by scanning sense amplifier 22d as an input signal labelled IN.

Likewise, scanning sense amplifier 22d generates an output signal OUT, which is received by scanning sense amplifier 22e as an input signal labelled IN. Scanning sense amplifier 22e generates an output signal OUT, which is received by scanning sense amplifier 22f as an input signal labelled IN. Scanning sense amplifier 22f generates an output signal OUT, which is received by scanning sense amplifier 22g as an input signal labelled IN. Scanning sense amplifier 22g generates an output signal OUT, which is received by scanning sense amplifier 22h as an input signal labelled IN. Finally, scanning sense amplifier 22h generates an output signal OUT, which is transferred outside of the array and scanning logic 12 as SCAN DATA OUTPUT.

Figure 3:
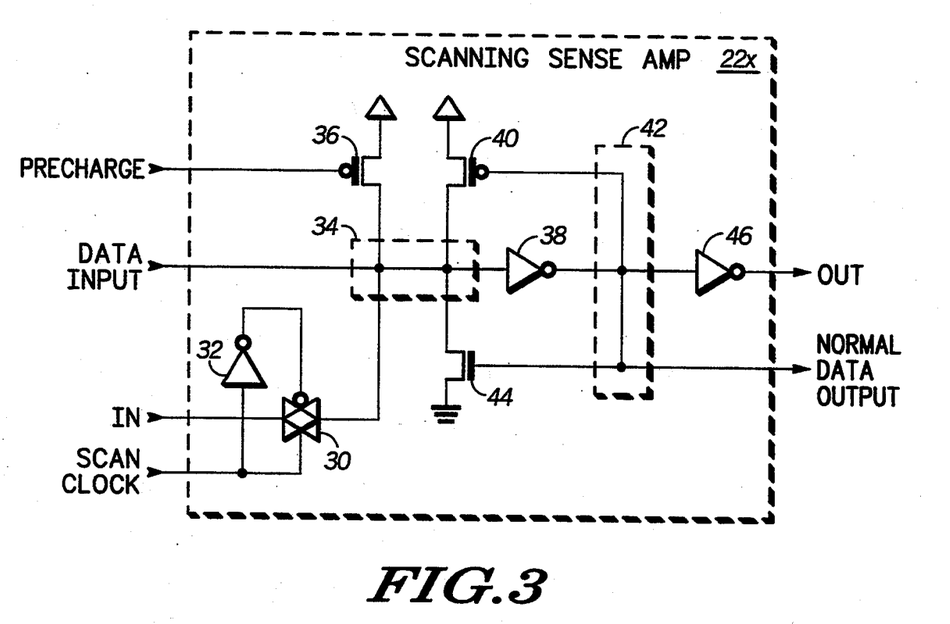
FIG. 3 illustrates, in schematic diagram form, a scanning sense amplifier of FIG. 2 in accordance with one embodiment of the present invention.

FIG. 3 illustrates a circuit implementation of one scanning sense amplifier 22x, which could be used as any of the scanning sense amplifiers (22a–22h) of FIG. 2. IN is an input signal to a CMOS transmission gate 30. SCAN CLOCK is a control input to the n-channel portion of CMOS transmission gate 30. SCAN CLOCK is an input to inverter 32. The output of inverter 32, SCAN CLOCK, is a control input to the p-channel portion of CMOS transmission gate 30. The output of CMOS transmission gate 30 is coupled to node 34. A p-channel MOS transistor 36 has a tint current electrode connected to a positive power supply voltage, a second current electrode connected to node 34, and a control electrode connected to the PRECHARGE signal. Node 34 is connected to the DATA INPUT signal and to an input of an inverter 38.

Still referring to FIG. 3, a p-channel MOS transistor 40 has a first current electrode connected to a positive power supply voltage, a second current electrode connected to node 34, and a control electrode connected to a node 42. An output of inverter 38 is also coupled to node 42. An n-channel MOS transistor 44 has a first current electrode connected to ground, a second current electrode connected to node 34, and a control electrode connected to node 42. An input of an inverter 46 is connected to node 42, and an output of inverter 46 is connected to output signal OUT. The output signal NORMAL DATA OUTPUT is connected to node 42. Transistors 40 and 44 form an inverter which has an input connected to node 42 and an output connected to the input of inverter 38. Inverter 46 is used to invert and buffer the output signal from inverter 38.

Scanning sense amplifier 22x can perform three functions, namely, the function of a sense amplifier, a master test latch for scan testing, and a slave test latch for scan testing. Scanning sense amplifier 22x can only perform one of these functions at a time. Node 34 is the input node to the scanning sense amplifier 22x. Node 34 can do only one of the following at a time: (1) be precharged using transistor 36; (2) receive an input value from array 20 across the DATA INPUT signal; or (3) receive an input value across the IN input signal.

Node 34 is precharged high to the voltage of the positive power supply prior to the assertion of the ARRAY ENABLE signal. When ARRAY ENABLE is asserted, DATA INPUT either leaves node 34 high, or pulls node 34 low to ground. The IN input signal is only used during scan testing. When the IN input signal is being used, the precharging of node 34 is disabled and the DATA INPUT signal is disabled. When SCAN CLOCK is a binary zero value, the output of transmission gate 30 is tri-stated (i.e. the output of transmission gate 30 is not being driven, but is high impedance).

The feedback path connecting the output of inverter 38 to the inputs of transistors 40 and 44 allows scanning sense amplifier 22x to operate down to a minimum operating frequency of zero Hertz. Alternate embodiments of the present invention could use a dynamic design instead of a static design. A dynamic design of scanning sense amplifier 22x would rely on charge stored on nodes and would require that the operating frequency not drop below a minimum frequency.

Figure 4:
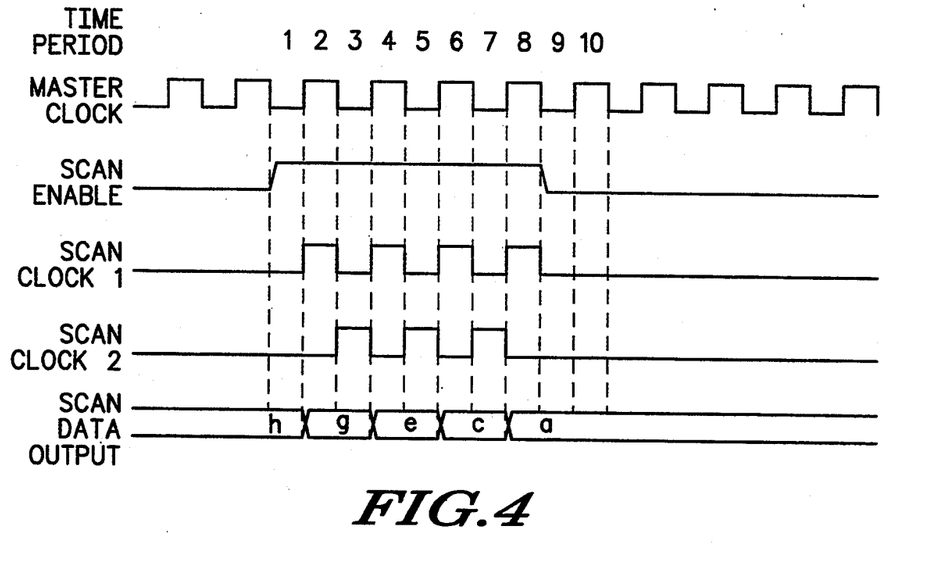
FIG. 4 illustrates, in timing diagram form, time periods and waveforms used in one embodiment of the present invention.
Figure 5:
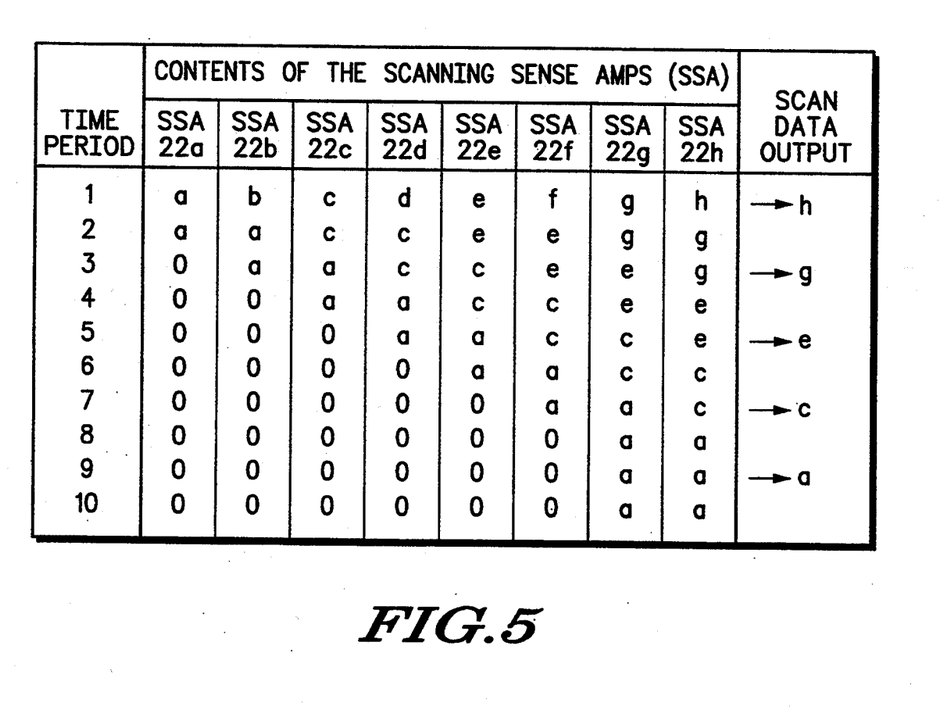
FIG. 5 illustrates, in tabular form, the contents of scanning sense amplifiers of FIG. 2 at different time periods in accordance with one embodiment of the present invention.
Figure 6:
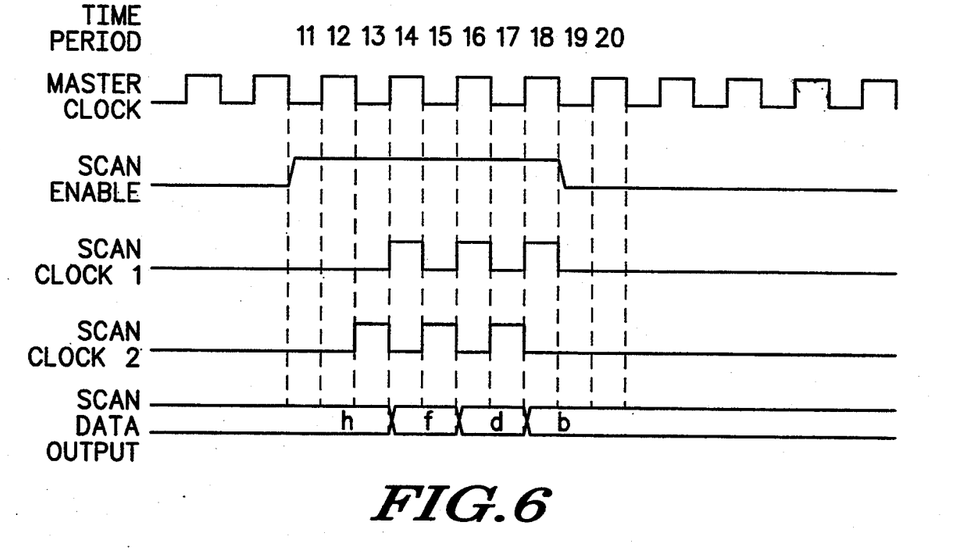
FIG. 6 illustrates, in timing diagram form, time periods and waveforms used in one embodiment of the present invention.
Figure 7:
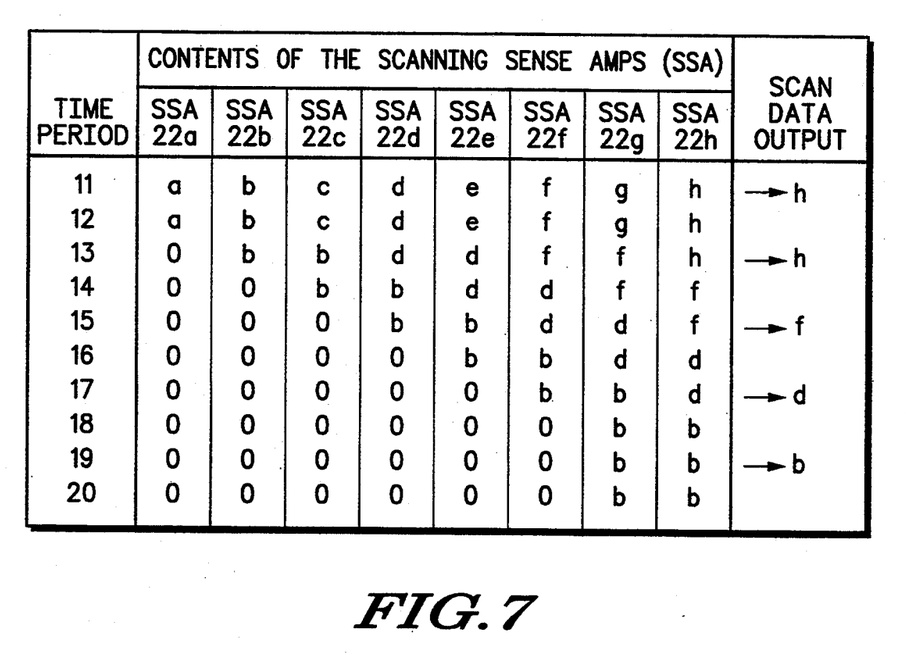
FIG. 7 illustrates, in tabular form, the contents of scanning sense amplifiers of FIG. 2 at different time periods in accordance with one embodiment of the present invention.

The present invention requires that the same ARRAY STIMULUS signals be applied to array 20 twice. In the present embodiment, the ARRAY STIMULUS signals are latched at the input to array 20 and the ARRAY ENABLE signal is asserted twice, once for each application of the stimulus. But other embodiments could directly apply the ARRAY STIMULUS signals twice without requiting the use of an ARRAY ENABLE signal. Regardless of how it is performed, the first application of the stimulus results in the events that occur during time periods 1 through 10 as illustrated in FIG. 4 and FIG. 5. The second application of the same stimulus results in the events that occur during time periods 11 through 20 as illustrated in FIG. 6 and FIG. 7.

FIG. 4 illustrates a timing diagram of several time periods and waveforms used in one embodiment of the present invention. The time periods are labelled 1 through 10. The MASTER CLOCK and SCAN ENABLE signals are the signals used to generate SCAN CLOCK 1 and SCAN CLOCK 2. In the present embodiment, the SCAN ENABLE signal is used to indicate that the data processing system 10 is in a test mode and that the scan testing of array 20 is currently being performed.

The letters contained within each of the SCAN DATA OUTPUT bits represent the location of the scanning sense amplifier 22x which was the origin of that particular SCAN DATA OUTPUT bit. The original content of each scanning sense amplifier 22x is the DATA INPUT value received from the array 20. The original content of each scanning sense amplifier 22x is represented by the letter "x". For example, the original content of scanning sense amplifier 22a is represented by the letter "a". And the original content of scanning sense amplifier 22h is represented by the letter "h". In the present embodiment, the contents "x" of each scanning sense amplifier 22x is a single binary bit of information, either a binary zero or a binary one.

FIG. 5 is a table illustrating the value of both the SCAN DATA OUTPUT signal and the contents of the eight scanning sense amplifiers (22a–22h) of FIG. 2 at the time periods 1 through 10 shown in FIG. 4. The first column, labelled "TIME PERIOD", corresponds to the time periods 1 through 10 illustrated in FIG. 4. The second column, labelled "CONTENTS OF THE SCANNING SENSE AMPS (SSA)", illustrates how the contents of the eight scanning sense amplifiers (22a–22h) change during the different time periods. And the third column, labelled "SCAN DATA OUTPUT", corresponds to the value of the SCAN DATA OUTPUT signal that is shifted out of scanning sense amplifier 22h during the different time periods.

FIG. 6 illustrates a timing diagram of several time periods and waveforms used in one embodiment of the present invention. The time periods are labelled 11 through 20. The MASTER CLOCK and SCAN ENABLE signals are used to generate SCAN CLOCK 1 and SCAN CLOCK 2. In the present embodiment, the SCAN ENABLE signal is used to indicate that the data processing system 10 is in a test mode and that the scan testing of array 20 is currently being performed.

FIG. 7 is a table illustrating the value of both the SCAN DATA OUTPUT signal and the contents of the eight scanning sense amplifiers (22a–22h) of FIG. 2 at the time periods 11 through 20 shown in FIG. 6. The first column, labelled "TIME PERIOD", corresponds to the time periods 11 through 20 illustrated in FIG. 6. The second column, labelled "CONTENTS OF THE SCANNING SENSE AMPS (SSA)", illustrates how the contents of the eight scanning sense amplifiers (22a–22h) change during the different time periods. And the third column, labelled "SCAN DATA OUTPUT", corresponds to the value of the SCAN DATA OUTPUT signal that is shifted out of scanning sense amplifier 22h during the different time periods.

The operation of the present invention will now be described. The purpose of testing an array is to ensure that the array produces the correct outputs for a given set of inputs. Array 20 is tested by applying various stimuli to the array 20 by way of the ARRAY STIMULUS signals, and by enabling the array using the ARRAY ENABLE signal. The array 20 then produces output signals that are received by the scanning sense amplifiers (22a–22h) across the DATA INPUT signals. The present invention allows the information stored in the scanning sense amplifiers (22a–22h) to be serially transmitted across the SCAN DATA OUTPUT signal during testing, while requiring a minimum of circuitry.

In order for the array 20 to be properly tested, the original contents of each of the scanning sense amplifiers (22a–22h) must be scanned out using the SCAN DATA OUTPUT signal. In order to scan out the original contents of each of the scanning sense amplifiers (22a–22h), the present invention requires that the same ARRAY STIMULUS signals be applied to array 20 twice. The first application of the stimulus results in the events that occur during time periods 1 through 10 as illustrated in FIG. 4 and FIG. 5. During time periods I through 10, the SCAN DATA OUTPUT signal scans out the original contents of scanning sense amplifiers 22h, 22g, 22e, 22c, and 22a.

The second application of the same stimulus results in the events that occur during time periods 11 through 20 as illustrated in FIG. 6 and FIG. 7. During time periods 11 through 20, the SCAN DATA OUTPUT signal scans out the original contents of scanning sense amplifiers 22h, 22h, 22f, 22d, and 22b. Thus, at the end of time period 20, the original contents of each of the scanning sense amplifiers (22a–22h) have been scanned out at least once.

The primary difference between time periods 1 through 10 and time periods 11 through 20 arises because of the SCAN CLOCK 1 and SCAN CLOCK 2 signals. In time periods 1 through 10, SCAN CLOCK 1 is asserted first and is asserted four times. Whereas in time periods 11 through 20, SCAN CLOCK 2 is asserted first and is asserted only three times. As a result, the original values "h", "g", "e", "c", and "a" are scanned out during time periods 1 through 10, whereas the original values "h", "h", "f", "d", and "b" are scanned out during time periods 11 through 20.

Referring to FIG. 2, FIG. 4, and FIG. 5, the method of scanning during time periods 1 through 10 will now be described. As illustrated in FIG. 5, the scanning sense amplifiers (22a–22h) originally contain the values "a" through "h", respectively, during time period 1. The present embodiment illustrates a data flow from left to right, but alternate embodiments could use a data flow from right to left. During time period 1, the value "h" is driven on the SCAN DATA OUTPUT signal by scanning sense amplifier 22h.

During time period 2, SCAN CLOCK 1 is asserted. As a result, the CMOS transmission gate 30 of each scanning sense amplifier 22b, 22d, 22f, and 22h is enabled and allows the new data received by the IN input to be stored. Thus scanning sense amplifiers 22a, 22c, 22e, and 22g shift data into scanning sense amplifiers 22b, 22d, 22f, and 22h. As a result, the values previously stored by the scanning sense amplifiers 22b, 22d, 22f, and 22h are overwritten and lost.

So during time period 2, the present contents of scanning sense amplifier 22a is shifted into scanning sense amplifier 22b. Thus the value "b", which was previously stored in scanning sense amplifier 22b, is overwritten by the value "a". Likewise, the present contents of scanning sense amplifier 22c is shifted into scanning sense amplifier 22d. Thus the value "d", which was previously stored in scanning sense amplifier 22d, is overwritten by the value "c". Likewise, the present contents of scanning sense amplifier 22e is shifted into scanning sense amplifier 22f. Thus the value "f", which was previously stored in scanning sense amplifier 22f, is overwritten by the value "e". And in the same manner, the present contents of scanning sense amplifier 22g is shifted into scanning sense amplifier 22h. Thus the value "h", which was previously stored in scanning sense amplifier 22h, is overwritten by the value "g".

During time period 3, SCAN CLOCK 2 is asserted. As a result, the CMOS transmission gate 30 of each scanning sense amplifier 22a, 22c, 22e, and 22g is enabled and allows the new data received by the IN input to be stored. Thus scanning sense amplifiers 22b, 22d, and 22f shift data into scanning sense amplifiers 22c, 22e, and 22g. As a result, the values previously stored by the scanning sense amplifiers 22a, 22c, 22e, and 22g are overwritten and lost. During time period 3, the value "g" is driven on the SCAN DATA OUTPUT signal by scanning sense amplifier 22h. Note that because the IN input to scanning sense amplifier 22a is grounded, a binary zero is transferred into scanning sense amplifier 22a.

The overall effect, during time period 3, is that the scanning sense amplifiers (22a–22h) appear to collectively function as a simple shift register, with each scanning sense amplifier (22a–22h) functioning as one bit of the shift register. The value stored in each scanning sense amplifier (22a–22h) appears to be shifted to the right one bit.

In actuality, however, the present contents of scanning sense amplifier 22b is shifted into scanning sense amplifier 22c. Thus the original value "c" stored in scanning sense amplifier 22c is overwritten by the value "a". Likewise, the present contents of scanning sense amplifier 22d is shifted into scanning sense amplifier 22e. Thus the original value "e" stored in scanning sense amplifier 22e is overwritten by the value "c". Likewise, the present contents of scanning sense amplifier 22f is shifted into scanning sense amplifier 22g. Thus the original value "g" stored in scanning sense amplifier 22g is overwritten by the value "e".

During time period 4, the same steps from time period 2 are repeated. SCAN CLOCK 1 is again asserted. As a result, the CMOS transmission gate 30 of each scanning sense amplifier 22b, 22d, 22f, and 22h is enabled and allows the new data received by the IN input to be stored. Thus scanning sense amplifiers 22a, 22c, 22e, and 22g shift data into scanning sense amplifiers 22b, 22d, 22f, and 22h. As a result, the values previously stored by the scanning sense amplifiers 22b, 22d, 22f, and 22h are overwritten and lost.

During time period 5, the same steps from time period 3 are repeated. During time period 5, SCAN CLOCK 2 is again asserted. As a result, the CMOS transmission gate 30 of each scanning sense amplifier 22a, 22c, 22e, and 22g is enabled and allows the new data received by the IN input to be stored. Thus scanning sense amplifiers 22b, 22d, and 22f shift data into scanning sense amplifiers 22c, 22e, and 22g. As a result, the values previously stored by the scanning sense amplifiers 22a, 22c, 22e, and 22g are overwritten and lost. During time period 5, the value "e" is driven on the SCAN DATA OUTPUT signal by scanning sense amplifier 22h. Note that because the IN input to scanning sense amplifier 22a is grounded, a binary zero is again transferred into scanning sense amplifier 22a.

During time period 6, the same steps from time period 2 are repeated. During time period 7, the same steps from time period 3 are repeated, only the value "c" is driven on the SCAN DATA OUTPUT signal by scanning sense amplifier 22h. During time period 8, the same steps from time period 2 are repeated. During time period 9, the same steps from time period 3 are repeated, only the value "a" is driven on the SCAN DATA OUTPUT signal by scanning sense amplifier 22h. During time period 10, no significant changes take place.

At the end of time period 10, the original values from five of the eight scanning sense amplifiers 22a, 22c, 22e, 22g, and 22h have been transferred across the SCAN DATA OUTPUT signal. In order to transfer the original values from the remaining scanning sense amplifiers 22b, 22d, and 22f, the same array stimulus must be applied again to array 20. The second application of the same stimulus results in the events that occur during time periods 11 through 20 as illustrated in FIG. 6 and FIG. 7.

Referring to FIG. 2, FIG. 6, and FIG. 7, the method of scanning during time periods 11 through 20 will now be described. As illustrated in FIG. 7, the scanning sense amplifiers (22a–22h) originally contain the values "a" through "h", respectively, during time period 11. During time period 11, the value "h" is driven on the SCAN DATA OUTPUT signal by scanning sense amplifier 22h. During time period 12, no significant changes take place.

During time period 13, SCAN CLOCK 2 is asserted. As a result, the CMOS transmission gate 30 of each scanning sense amplifier 22a, 22c, 22e, and 22g is enabled and allows the new data received by the IN input to be stored. Thus scanning sense amplifiers 22b, 22d, and 22f shift data into scanning sense amplifiers 22c, 22e, and 22g. As a result, the values previously stored by the scanning sense amplifiers 22a, 22c, 22e, and 22g are overwritten and lost. During time period 13, the value "h" is again driven on the SCAN DATA OUTPUT signal by scanning sense amplifier 22h. Note that because the IN input to scanning sense amplifier 22a is grounded, a binary zero is transferred into scanning sense amplifier 22a.

So during time period 13, the present contents of scanning sense amplifier 22b is shifted into scanning sense amplifier 22c. Thus the value "c", which was previously stored in scanning sense amplifier 22c, is overwritten by the value "b". Likewise, the present contents of scanning sense amplifier 22d is shifted into scanning sense amplifier 22e. Thus the value "e", which was previously stored in scanning sense amplifier 22e, is overwritten by the value "d". And in the same manner, the present contents of scanning sense amplifier 22f is shifted into scanning sense amplifier 22g. Thus the value "g", which was previously stored in scanning sense amplifier 22g, is overwritten by the value "f".

During time period 14, SCAN CLOCK 1 is asserted. As a result, the CMOS transmission gate 30 of each scanning sense amplifier 22b, 22d, 22f, and 22h is enabled and allows the new data received by the IN input to be stored. Thus scanning sense amplifiers 22a, 22c, 22e, and 22g shift data into scanning sense amplifiers 22b, 22d, 22f, and 22h. As a result, the values previously stored by the scanning sense amplifiers 22b, 22d, 22f, and 22h are overwritten and lost.

The overall effect, during time period 14, is that the scanning sense amplifiers (22a–22h) appear to collectively function as a simple shift register, with each scanning sense amplifier (22a–22h) functioning as one bit of the shift register. The value stored in each scanning sense amplifier (22a–22h) appears to be shifted to the fight one bit.

In actuality, however, the present contents of scanning sense amplifier 22a is shifted into scanning sense amplifier 22b. Thus the value "b", which was previously stored in scanning sense amplifier 22b, is overwritten by the value "0". Likewise, the present contents of scanning sense amplifier 22c is shifted into scanning sense amplifier 22d. Thus the value "d", which was previously stored in scanning sense amplifier 22d, is overwritten by the value "b". Likewise, the present contents of scanning sense amplifier 22e is shifted into scanning sense amplifier 22f. Thus the value "f", which was previously stored in scanning sense amplifier 22f, is overwritten by the value "d". And in the same manner, the present contents of scanning sense amplifier 22g is shifted into scanning sense amplifier 22h. Thus the value "h", which was previously stored in scanning sense amplifier 22h, is overwritten by the value "f".

During time period 15, the same steps from time period 13 are repeated. During time period 5, SCAN CLOCK 2 is again asserted. As a result, the CMOS transmission gate 30 of each scanning sense amplifier 22a, 22c, 22e, and 22g is enabled and allows the new data received by the IN input to be stored. Thus scanning sense amplifiers 22b, 22d, and 22f shift data into scanning sense amplifiers 22c, 22e, and 22g. As a result, the values previously stored by the scanning sense amplifiers 22a, 22c, 22e, and 22g are overwritten and lost. During time period 15, the value "f" is driven on the SCAN DATA OUTPUT signal by scanning sense amplifier 22h. Note that because the IN input to scanning sense amplifier 22a is grounded, a binary zero is again transferred into scanning sense amplifier 22a.

During time period 16, the same steps from time period 14 are repeated. SCAN CLOCK 1 is again asserted. As a result, the CMOS transmission gate 30 of each scanning sense amplifier 22b, 22d, 22f, and 22h is enabled and allows the new data received by the IN input to be stored. Thus scanning sense amplifiers 22a, 22c, 22e, and 22g shift data into scanning sense amplifiers 22b, 22d, 22f, and 22h. As a result, the values previously stored by the scanning sense amplifiers 22b, 22d, 22f, and 22h are overwritten and lost.

During time period 17, the same steps from time period 13 are repeated, only the value "d" is driven on the SCAN DATA OUTPUT signal by scanning sense amplifier 22h. During time period 18, the same steps from time period 14 are repeated. During time period 19, the same steps from time period 13 are repeated, only the value "b" is driven on the SCAN DATA OUTPUT signal by scanning sense amplifier 22h. During time period 20, no significant changes take place.

Thus by the end of time periods I through 20, the original values from all eight scanning sense amplifiers (22a–22h) have been transferred across the SCAN DATA OUTPUT signal. The test circuitry (not shown) which receives the SCAN DATA OUTPUT signal merely ignores the extra two repetitions of the "h" value received from the scanning sense amplifier 22h. The test circuitry (not shown) can use the data scanned out from array 20 in order to determine if array 20 has malfunctioned.

It is important to note that the present invention does not significantly increase the test time required to test most arrays 20. The amount of time required to drive each data output bit on the SCAN DATA OUTPUT signal remains the same. Because most arrays have tens or hundreds of outputs, the one extra output data bit which is scanned out during each application of the stimulus does not cost very much of the overall test time. And the amount of additional overhead time to apply the same stimulus twice to array 20 is small.

In summation, the above specification describes a method and apparatus for scan testing an array in a data processing system. By using the scanning sense amplifiers (22a–22h) to perform three functions, the circuitry required for scan testing can be reduced. This reduction in circuitry can be made without significantly increasing the test time required to test most arrays. The three functions performed by each of the scanning sense amplifiers (22a–22h) are the function of a sense amplifier, a master test latch for scan testing, and a slave test latch for scan testing.

While the present invention has been illustrated and described with reference to specific embodiments, further modifications and improvements will occur to those skilled in the art. For example, any number of scanning sense amplifiers (22a22h) could be used, rather than just the eight shown in FIG. 2. Array 20 could be any type of array-type structure. Various circuits could be used to implement the scanning sense amplifiers (22a–22h).

It is to be understood, therefore, that this invention is not limited to the particular forms illustrated and that it is intended in the appended claims to cover all modifications that do not depart from the spirit and scope of this invention.

We claim:

1. A data processing system having a first logic element and having a second logic element, the first and second logic elements each comprising:
    a scan data input for receiving a scan data input signal;
    a non-scan data input;
    a first control input;
    a second control input;
    a scan data output;
    a first inverter having an input coupled to said non-scan data input, and having an output;
    a second inverter having an input connected to the output of said first inverter and having an output connected to the input of said first inverter;
    a transistor having a first current electrode connected to a power supply voltage terminal, having a gate electrode coupled to the first control input, and having a second current electrode coupled to the input of said first inverter; and
    coupling means for selectively coupling the scan data input to the input of said first inverter, said coupling means being coupled to said scan data input and the input of said first inverter; and
    wherein the scan data output of the first logic element is coupled to the scan data input of the second logic element, and a first control signal provided to the second control input of the first logic element is asserted during a first time period, and a second control signal provided to the second control input of the second logic element is negated during the first time period.

2. The invention as in claim 1, wherein said transistor is a p-channel MOS transistor which is used to precharge the input of the first inverter.

3. The invention as in claim 1, wherein said coupling means comprises a transmission gate, the first control signal is a first scan clock signal, and the second control signal is a second scan clock signal.

4. The invention as in claim 1, wherein each of the first and second logic elements further comprises:
    a third inverter, having an input connected to the output of said first inverter, and having an output coupled to said scan data output.

5. The invention as in claim 1, wherein each of the first and second logic elements further comprises:
    a non-scan data output, coupled to the output of said first inverter.

6. A data processing system comprising:
    a first scan clock signal;
    a second scan clock signal; and
    a plurality of logic elements each comprising a scan input, a scan output, a scan clock input, and storage means for storing a value present at the scan input when an active signal is present at the scan clock input, the plurality of logic elements is arranged as a series-connected chain with the scan output of each logic element in the series-connected chain, except for a last element of the series-connected chain, connected to the scan input of a subsequent logic element of the series-connected chain, each even numbered logic element in the series-connected chain receiving the first scan clock signal at the scan clock input and each odd numbered logic element in the series-connected chain receiving the second scan clock signal at the scan clock input.

7. A data processing system as in claim 6, wherein the scan input of a first element of the series-connected chain is coupled to ground.

8. A data processing system as in claim 6, wherein the scan output of the last element of the series-connected chain provides an output signal.

9. A data processing system as in claim 6, wherein the plurality of logic elements are sense amplifiers.

10. A data processing system as in claim 6, wherein each of the plurality of logic elements further comprises a data input.

11. A data processing system as in claim 10, further comprising:
    an array, coupled to the data input of each of the plurality of logic elements.

12. A method of serially scanning data from an array in a data processing system, comprising the steps of:
    receiving a first value from the array and storing the first value in a first latch;
    receiving a second value from the array and storing the second value in a second latch;
    receiving a third value from the array and storing the third value in a third latch;
    receiving a fourth value from the array and storing the fourth value in a fourth latch;
    overwriting the first value in the first latch with the second value from the second latch so that the first and second latches both contain the second value;
    overwriting the third value in the third latch with the fourth value from the fourth latch so that the third and fourth latches both contain the fourth value;
    overwriting the second value in the second latch with the fourth value so that the second and third latches both contain the fourth value; and
    providing the first value as an output signal; and
    wherein said step of overwriting the first value and said step of overwriting the third value are performed substantially simultaneously, and said step of overwriting the second value is performed subsequent to said step of overwriting the first value.

13. A method of claim 12, further comprising the step of:
    overwriting the fourth value in the fourth latch with a fifth value so that the fourth latch contains the fifth value.

14. A method of claim 13, wherein the fifth value is a binary zero.

15. A method of claim 12, further comprising the steps of:
    repeating said step of receiving a first value;
    repeating said step of receiving a second value;
    repeating said step of receiving a third value;
    repeating said step of receiving a fourth value; and
    overwriting the second value in the second latch with the third value from the third latch so that the second and third latches both contain the third value.

16. A method of claim 15, further comprising the steps of:
    (a) repeating said step of providing the first value as an output signal; and
    (b) providing the third value as the output signal subsequent to said step (a).

17. A method of claim 12, further comprising the step of:
    using the output signal in determining if the array has malfunctioned.

18. A method of claim 12, further comprising the steps of:
   providing the second value as the output signal subsequent to said step of overwriting the first value; and
   providing the fourth value as the output signal subsequent to said step of overwriting the second value.

19. A method of claim 12, further comprising the step of:
   applying a stimulus to the array prior to said step of receiving the first value.

20. A method of claim 19, further comprising the step of:
   repeating said step of applying the stimulus to the array subsequent to said step of overwriting the second value in the second latch.

* * * * *